US007853637B2

(12) United States Patent  (10) Patent No.: US 7,853,637 B2
Papadantonakis et al.  (45) Date of Patent:  Dec. 14, 2010

(54) METHOD AND SYSTEM FOR PIPELINING SATURATED ACCUMULATION AND OTHER LOOPS WITH LOOP-CARRIED DEPENDENCIES

(75) Inventors: Karl Papadantonakis, Pasadena, CA (US); Stephanie Chan, Chunglin (TW); André M. DeHon, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1173 days.

(21) Appl. No.: 11/331,830

(22) Filed: Jan. 12, 2006

(65) Prior Publication Data

US 2006/0282487 A1    Dec. 14, 2006

Related U.S. Application Data

(60) Provisional application No. 60/644,473, filed on Jan. 14, 2005.

(51) Int. Cl.
    *G06F 7/50*    (2006.01)
(52) U.S. Cl. ..................................... 708/670
(58) Field of Classification Search ................. 708/603, 708/670, 700
    See application file for complete search history.

(56) References Cited

U.S. PATENT DOCUMENTS 6,330,660 B1 *  12/2001  Ganapathy et al. ............ 712/41
6,842,845 B2 *   1/2005  Ganapathy et al. ............ 712/36

OTHER PUBLICATIONS

Balzola, P.I., et al., "Design Alternatives for Parallel Saturating Multioperand Adders," *Proceedings of the International Conference on Computer Design*, pp. 172-177 (Sep. 2001).
Lee, C., et al., "MediaBench: A Tool for Evaluating and Synthesizing Multimedia and Communications Systems," *International Symposium on Microarchitecture*, pp. 330-335 (1997).
Papadantonakis, K., et al., "Pipelining Saturated Accumulation," IEEE *International Conference on Field Programmable Technology* (Dec. 11-14, 2005).
Barua, et al., "Maps: A compiler-managed memory system for raw machines", Saman Amarasinghe, Anant Agarwal, cag-www.lc.mit.edu/raw, 1998.
Brent, et al., "A regular layout for parallel adders", IEEE Transaction on Computers, vol. C-31, 1982.
DeHon, et al., "Design Patterns for Reconfigurable Computing", IEEE Symposium on Field-Programmable Custom Computing Machines, 2004.

(Continued)

*Primary Examiner*—Chuong D Ngo
(74) *Attorney, Agent, or Firm*—Steinfl & Bruno LLP (57) ABSTRACT

Aggressive pipelining allows Field Programmable Gate Arrays (FPGAs) to achieve high throughput on many Digital Signal Processing applications. However, cyclic data dependencies in the computation can limit pipelining and reduce the efficiency and speed of an FPGA implementation. Saturated accumulation is an important example where such a cycle limits the throughput of signal processing applications. A reformulation of saturated addition as an associative operation permits a parallel-prefix calculation to be used to perform saturated accumulation at any data rate supported by the device. The method may be extended to other operations containing loops with one or more loop-carried dependencies.

12 Claims, 9 Drawing Sheets

OTHER PUBLICATIONS

DeHon, et al., "The density advantage of configurable computing", IEEE Configurable Computing, 2000.

Hillis, et al., "Data parallel algorithms", Communications of the ACM, vol. 29, No. 12, 1986.

Luo, et al., "Accelerating pipelined integer and floating-point accumulations in configurable hardware with delayed addition techniques", IEE Transactions on Computers, vol. 49, No. 3, 2000.

Singh, et al., "The case for registered routing switches in field programmable gate arrays", ACM, 2001.

Tsu, et al., "HSRA: High-Speed, Hierarchical Synchronous Reconfigurable Array", ACM, 1999.

Von Herzen, "Signal processing at 250 MHz using high-performance FPGA's", ACM, 1997.

Weaver, et al., Post-placement C-slow retiming for the xilinx virtex, FPGA, 2003.

Weaver, et al., "The SFRA: A corner-Turn FPGA Architechture", FPGA, 2004.

Winograd, "On time required to perform addition", Journal of the Association for computing machine, vol. 12, No. 2, 1965.

Xilinx, Inc., 2100 Logic Drive, San Jose, CA 95124, *RocketIO X Transceiver User Guide*, r2002.

* cited by examiner

$$\begin{aligned}
SA_{[x2,m2,M2]} &\circ SA_{[x1,m1,M1]} \\
&\stackrel{\text{I}}{=} ct_{M2} \circ cb_{m2} \circ tr_{x2} \circ ct_{M1} \circ cb_{m1} \circ tr_{x1} \\
&\stackrel{\text{II}}{=} ct_{M2} \circ cb_{m2} \circ ct_{M1+x2} \circ cb_{m1+x2} \circ tr_{x1+x2} \\
&\stackrel{\text{III}}{=} ct_{M2} \circ ct_{\max(M1+x2,m2)} \circ cb_{\max(m1+x2,m2)} \circ tr_{x1+x2} \\
&= ct_{\min(\max(M1+x2,m2),M2)} \circ cb_{\max(m1+x2,m2)} \circ tr_{x1+x2} \\
&= SA_{[x1+x2,\max(m1+x2,m2),\min(\max(M1+x2,m2),M2)]}
\end{aligned}$$

METHOD AND SYSTEM FOR PIPELINING SATURATED ACCUMULATION AND OTHER LOOPS WITH LOOP-CARRIED DEPENDENCIES

CROSS-REFERENCE TO RELATED APPLICATION

This application claims the benefit of U.S. provisional patent application Ser. No. 60/644,473, filed Jan. 14, 2005 for a "Technique for Pipelining Saturated Accumulation and Other Loops with Loop-Carried Dependencies" by Karl Papadantonakis, Stephanie Chan, and André M. DeHon, the disclosure of which is incorporated herein by reference.

STATEMENT REGARDING FEDERALLY SPONSORED RESEARCH OR DEVELOPMENT

The present invention was made with support from the United States Government under Grant No. CCR-0205471 awarded by the National Institutes of Health. The United States Government has certain rights in the invention.

BACKGROUND OF THE INVENTION

1. Field of the Invention

The present invention relates to arithmetic processing and calculating using an electrical computer.

2. Description of the Prior Art

Field Programmable Gate Arrays (FPGAs) have high computational density (e.g., they offer a large number of bit operations per unit space-time) when they can be run at high throughput. To achieve this high density, designs must be aggressively pipelined to exploit the large number of registers in FPGA architectures. In the extreme, designs are pipelined so that only a single Look Up Table (LUT) delay and local interconnect is in the latency path between registers. Pipelined at this level, conventional FPGAs should be able to run with clock rates in the hundreds of megahertz.

Pipelining may always be performed for acyclic designs (feed forward dataflow). It may be necessary to pipeline the interconnect, but the transformation can be performed and automated.

However, when a design has a cycle which has a large latency but only a few registers in the path, pipelining to this limit cannot be immediately performed. No legal retiming will allow reduction of the ratio between the total cycle logic delay (e.g., the number of LUTs in the path) and the total registers in the cycle. This often prevents pipelining the design all the way down to the single LUT plus local interconnect level and consequently prevents operation at peak throughput to use the device efficiently.

The device may be used efficiently by interleaving parallel problems in C-slow fashion, but the throughput delivered to a single data stream is limited. In a spatial pipeline of streaming operators, the throughput of the slowest operator will serve as a bottleneck, forcing all operators to run at the slower throughput, preventing achievement of high computational density.

The use of associative reduce trees on modulo arithmetic (including modulo addition and modulo accumulation) to introduce parallelism into accumulations, reducing the time required to accumulate numbers, is known.

The use of parallel prefix to compute a series of partial intermediate partial sums in a modulo addition with only a constant factor more operators than the associative reduce tree, which can produce the final sum, is known.

The use of delayed addition to perform a modulo accumulation step in constant (O(1)) time, being prepared for the next input, is known.

As a result, modulo accumulation admits to area-time tradeoffs which allow spending area (parallelism) to increase the throughput of accumulation (handle more input values per unit time). Modulo accumulation can be performed arbitrarily fast compared to the raw speed of the gates.

The use and value of saturated addition to keep accumulator widths low while accumulating data which may overflow (or underflow) the accumulator width is known.

Saturated accumulation, however, is often a slow operation limiting clockrates on designs. Saturated accumulation is a common signal processing operation with a cyclic dependence which prevents aggressive pipelining. As such, it can serve as the rate limiter in streaming applications.

Hitherto, it has been believed that saturated accumulation is "not" an associative operation and hence the associative transformation techniques for trading increased area for reduced time (increased throughput) which worked for modulo addition (e.g., associative reduce, parallel prefix, delayed addition) will not directly apply to saturated accumulation.

P. I. Balzola, M. J. Schulte, J. Ruan, J. Glossner, and E. Hokenek, in "Design Alternatives for Parallel Saturating Multioperand Adders," Proceedings of the International Conference on Computer Design, September 2001, pp. 172-177, attacked the problem of saturating accumulation at the bit level. They observed they could reduce the logic in the critical cycle by computing partial sums for the possible saturation cases and using a fast, bit-level multiplexing network to rapidly select and compose the correct final sums. They were able to reduce the cycle so it only contained a single carry-propagate adder and some bit-level multiplexing. For custom designs, this minimal cycle may be sufficiently small to provide the desired throughput although it may not be suitable when the designer has less freedom to implement a fast adder and must pay for programmable interconnect delays for the bit-level control.

Many operations would benefit from being able to use fast saturated accumulation.

Therefore, techniques and methods are needed that provide fast saturated accumulation. There is a need for techniques and methods that allow performing an area-time tradeoff for saturated accumulations, allowing the spending of additional area to increase the throughput of bit-accurate saturated accumulation at fixed gate speeds.

Saturated accumulation is an example of an operation with a loop carried dependency. A loop is a sequence of statements which is specified once but which may be performed several times in succession (iterations). A loop carried-dependency results when an iteration of a loop computes a value that is required by a subsequent iteration of the loop. In general, there is a need for techniques and methods that permit increased speed of processing loops with loop-carried dependencies, such as but not limited to saturated accumulation.

There is a need for techniques and methods that allow performing an area-time tradeoff for loops with loop-carried dependencies, allowing the spending of additional area to increase the throughput at fixed gate speeds.

SUMMARY

The methods revealed in this disclosure are general and permit pipelining saturated accumulations or other loops with loop-carried dependencies to any throughput which the device can support.

The present disclosure provides an approach to the solution of the problem of pipelining saturated accumulation so that the accumulation will run at any data rate supported by a computing device such as a FPGA. Methods and techniques are provided for making the saturating operations associative and giving a general technique to perform area-time tradeoffs for saturated addition.

According to a first aspect of the present invention, a method for pipelining a loop with one or more loop-carried dependencies in a data processor is provided, comprising: reformulating the loop as a composition of a series of functions; and computing the loop over a plurality of loop iterations in parallel using associative transformations.

According to a second aspect of the present invention, a method for pipelining saturated accumulations by performing associative composition of saturated additions in a data processing system, is provided, comprising: representing a first saturated addition operation as a first set of three numbers; representing a second saturated addition operation to be performed in sequence to first saturated addition operation as a second set of three numbers; combining the first and second sets of three numbers representing the first and second addition operations into a third set of three numbers; and performing a saturated addition operation using the third set of three numbers such that the result of applying this new saturated addition to an input is equivalent to applying the first and second saturated addition operations in sequence.

According to a third aspect of the present invention, a data processing system capable of performing saturated additions is provided, comprising the representation of saturated additions as associative composition.

According to a fourth aspect of the present invention, a method for performing saturated addition in a data processing system on a sequence of N numbers requiring depth less than N is provided, comprising: reformulating saturated addition as a composition of a series of functions; and building a parallel-prefix tree in order to compute the saturated addition over a plurality of saturated addition iterations in parallel.

According to a fifth aspect of the present invention, a method for use in a data processing system is provided, comprising: providing a first saturated addition; providing a second saturated addition; and combining the first saturated addition and the second saturated addition into a single saturated addition.

According to a sixth aspect of the present invention, a method for use in a data processing system is provided, comprising specializing a linear dependent sequence of saturated additions wherein inputs that are not generated by previous iterations of a saturated addition loop arrive early into a single saturated addition for an unknown late input.

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENTS

The Annex incorporated as part of this specification is a copy of an article entitled "Pipelining Saturated Accumulation" appearing in the report of the IEEE International Conference on Field-Programmable Technology (FPT 2005), Dec. 11-14, 2005. The Annex will be referred to in the specification that follows for tables, references, and proofs.

OVERVIEW

Efficient implementations of arithmetic on real computing devices with finite hardware must deal with the fact that integer addition is not closed over any non-trivial finite subset of the integers. Some computer arithmetic systems deal with this by using addition modulo a power of two (e.g., addition modulo $2^{32}$ is provided by most microprocessors).

However, for many applications, modulo addition has bad effects, creating aliasing between large numbers which overflow to small numbers and small numbers. Consequently, designers are driven to use a large modulus (a large number of bits) in an attempt to avoid this aliasing problem.

An alternative to using wide datapaths to avoid aliasing is to define saturating arithmetic. Instead of wrapping the arithmetic result in modulo fashion, the arithmetic sets bounds and clips sums which go out of bounds to the bounding values. That is, a saturated addition is defined as:

```
SA(a, b, minval, maxval) {
    tmp = a + b;                          // tmp can hold sum
                                          // without wrapping
    if           (tmp > maxval)  return (maxval);
    elseif       (tmp < minval)  return (minval);
    else return (tmp)
}
```

Since large sums cannot wrap to small values when the precision limit is reached, this admits economical implementations which use modest precision for many signal processing applications.

A saturated accumulator takes a stream of input values $x_i$ and produces a stream of output values $y_i$, as shown in Equation (1):

$$y_i = SA(y_i-1, x_i, \text{minval}, \text{maxval}) \quad (1)$$

Table 1 in the Annex gives an example showing the difference between modulo and saturated accumulation.

Example: ADPCM

Figure 1:
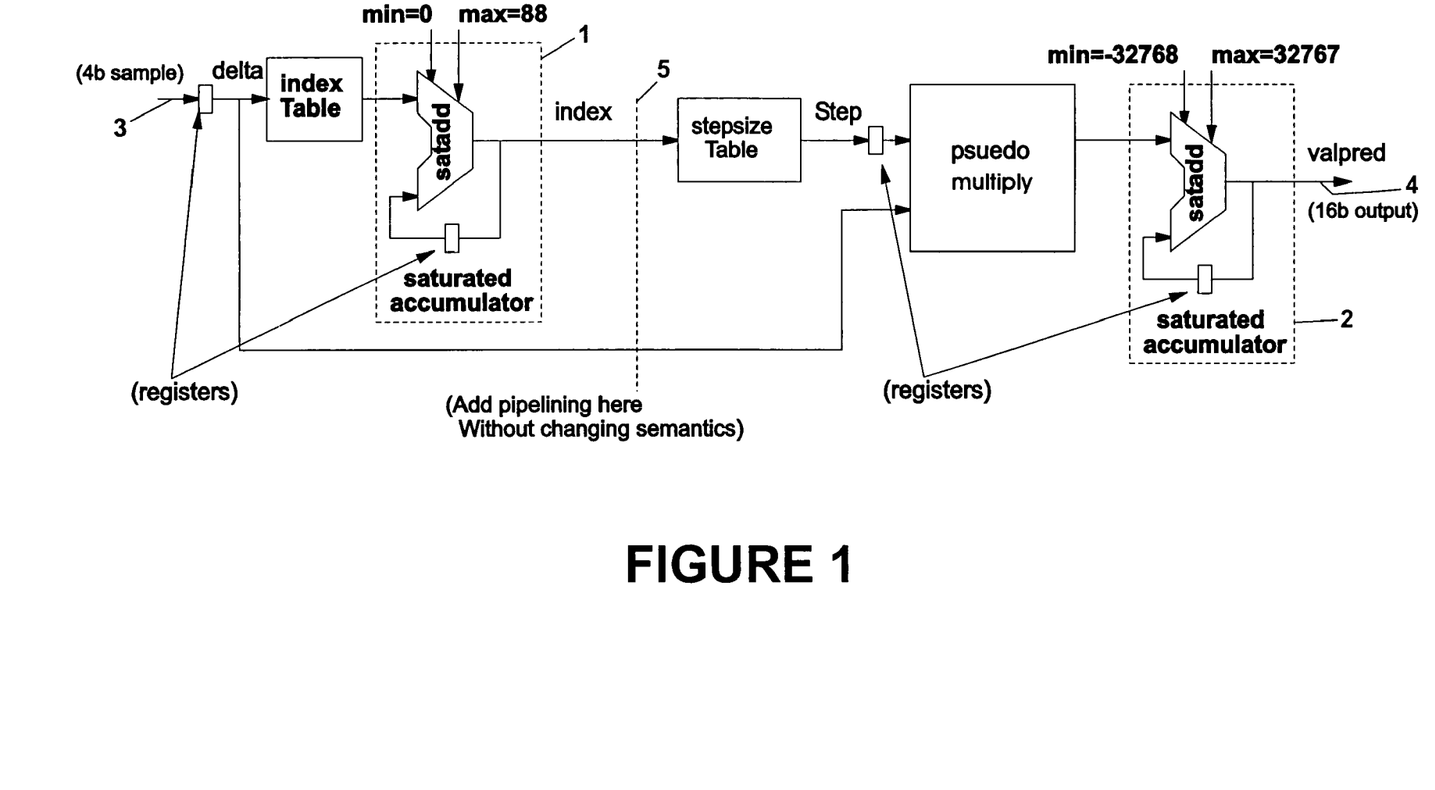
FIG. 1 shows a diagram of the dataflow for a Adaptive Differential Pulse-Compression Modulation application.

The decoder in the Adaptive Differential Pulse-Compression Modulation (ADPCM) application in the mediabench benchmark suite, disclosed in C. Lee, M. Potkonjak, and W. H. Mangione-Smith, "MediaBench: A Tool for Evaluating and Synthesizing Multimedia and Communications Systems," in International Symposium on Microarchitecture, 1997, pp. 330-335, provides a concrete example where saturated accumulation is the bottleneck limiting application throughput. FIG. 1 shows the dataflow path for the ADPCM decoder. The only cycles which exist in the dataflow path are the two saturated accumulators 1 and 2. Pipeline delays can be accommodated at the beginning of the datapath 3, at the end of the datapath 4, and even in the middle 5 between the two saturated accumulators without changing the semantics of the decoder operation. As with any pipelining operation, such pipelining will change the number of cycles of latency between the input (delta at the beginning of the datapath 3) and the output (valpred at the end of the datapath 4).

Previous attempts to accelerate the mediabench applications for spatial (hardware or FPGA) implementation have achieved only modest acceleration on ADPCM. This has led to a characterization of ADPCM as a serial application. It is desirable to parallelize this application and this can be done with the new transformations discussed below.

Associativity

Both infinite precision integer addition and modulo addition are associative. That is:

$$(A+B)+C=A+(B+C).$$

However, saturated addition is not associative. For example, consider:

$$250+100-11$$

infinite precision arithmetic:

$$(250+100)-11=350-11=339$$

$$250+(100-11)=250+89=339$$

modulo 256 arithmetic:

$$(250+100)-11=94-11=83$$

$$250+(100-11)=250+89=83$$

saturated addition (max=255):

$$(250+100)-11=255-11=244$$

$$250+(100-11)=250+89=255$$

Consequently, a designer has more freedom in implementing infinite precision or modulo addition than she does when implementing saturating addition.

Associative Reduce

When associativity holds, the associative property may be exploited to reshape the computation to allow pipelining. Consider a modulo-addition accumulator:

$$y_i = y_{i-1} + x_i \qquad (2)$$

The accumulation sum may be unrolled as follows:

$$y_i = ((y_{i-3} + x_{i-2}) + x_{i-1}) + x_i \qquad (3)$$

Exploiting associativity, this unrolled sum may be rewritten as:

$$y_i = ((y_{i-3} + x_{i-2}) + (x_{i-1} + x_i)) \qquad (4)$$

Whereas the original sum had a series delay of three adders, the re-associated sum has a series delay of two adders. In general, this accumulation can be un-rolled N−1 times and the computation depth reduced from N−1 to $\log_2(N)$ adders.

With this reassociation, the delay of the addition tree grows as log (N) while the number of clock sample cycles grows as N. The unrolled cycle allows the designer to add registers to the cycle faster (N) than delays are added (log(N)). Consequently, N can be selected to be sufficiently large to allow arbitrary retiming of the accumulation.

Parallel Prefix Tree

When associativity holds, the final sum of N values may be computed in O(log (N)) time using O(N) adders. With only a constant factor more hardware, all N intermediate outputs can actually be computed: $y_i, y_{i-1}, \ldots y_{(1-(N-1))}$. This can be done using parallel prefix computation in the form of a parallel prefix tree.

Parallel prefix computation is preferred because it produces all the intermediate values (the entire sequence), whereas associative reduce or delayed addition computation only produce the final value. When only the final sum is needed (as is the case in some accumulation scenarios), then associative reduce or delayed addition computation will be adequate. However, if all the intermediate values (all the $y_i$'s) are wanted, then parallel prefix is an efficient way to extend the associative reduce computation in order to compute these intermediate values.

Naïve computation of all the intermediate values with a set of associative operations is possible and would require $O(N^2)$ operations. Parallel prefix computation is based on the observation that there would be considerable redundancy in such a calculation. By sharing the intermediates, all the intermediates may be computed with O(N) operations.

Figure 2:
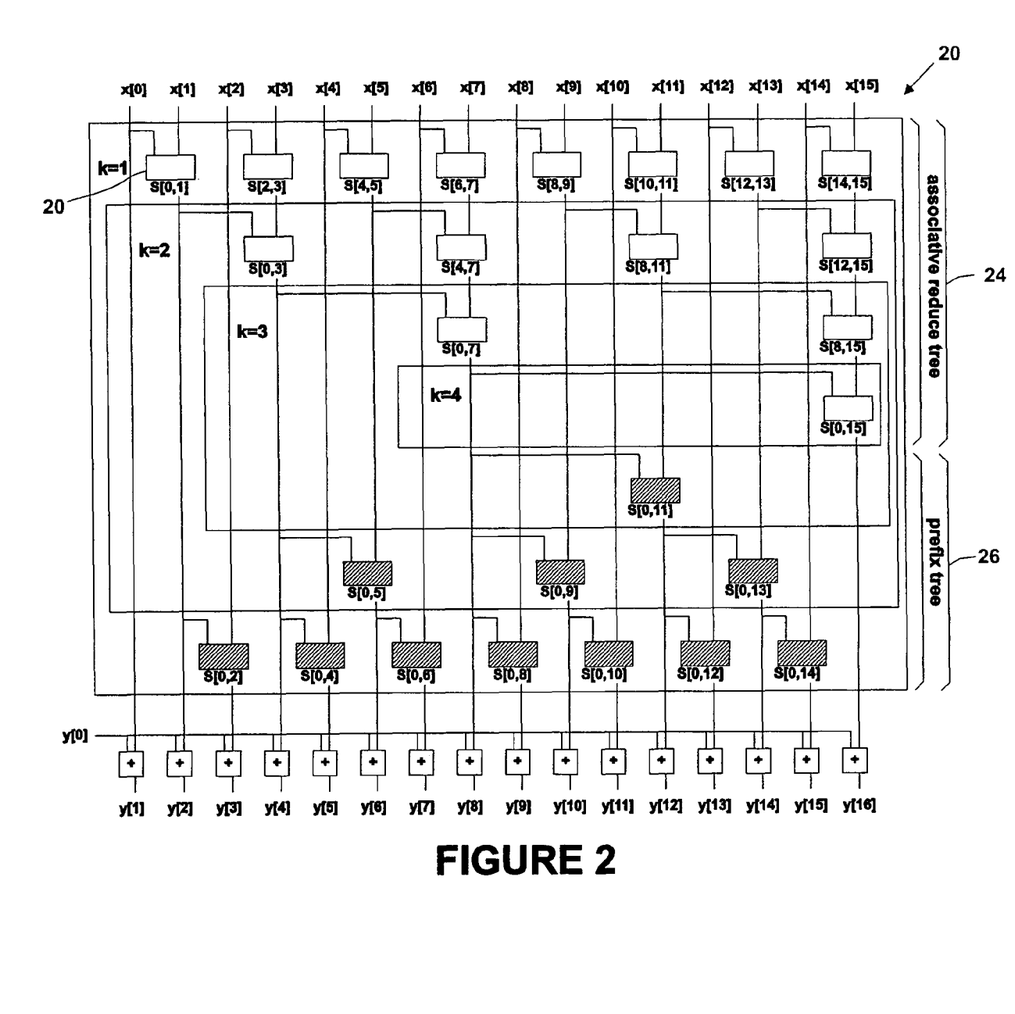
FIG. 2 shows a schematic of a 16-input parallel-prefix tree.

FIG. 2 shows a width-16 parallel-prefix tree 20 having twenty-six adders 22 that may be used for saturated accumulation. Thus, the computation of intermediate outputs can be accomplished by computing and combining partial sums of the form S[s, t] which represents the sum: $x_s + x_{s+1} + \ldots x_t$. When the associative reduce tree 24 is built, at each level k, $S[(2j)2^k, (2j+1)2^k - 1]$ and $S[(2j+1)2^k, 2(j+1)2^k - 1]$ are combined to compute $S[(2j)2^k, 2(j+1)2^k - 1]$. Consequently, prefix spans from 0 to $2^k - 1$ (the j=0 case) are eventually computed, but the other prefixes are not eventually computed.

The $S[0, 2^k - 1]$ prefixes may be combined with the $S[2^{k_0}, 2^{k_0} + 2^{k_1} - 1]$ spans ($k_1 < k_0$) to compute the intermediate results. To compute the full prefix sequence (S[0, 1], S[0, 2], . . . S[0, N−]), a second (reverse) tree 26 is added to compute these intermediate prefixes. At each tree level where a compose unit is found in the forward, associative reduce tree 24, one more (at most), matching, compose unit is added in this reverse tree 26. The reverse, or prefix, tree 26 is no larger than the associative reduce tree 24; consequently, the entire parallel-prefix tree is at most twice the size of the associative reduce tree 24.

Associative Reformulation of Saturated Accumulation

Figure 3:
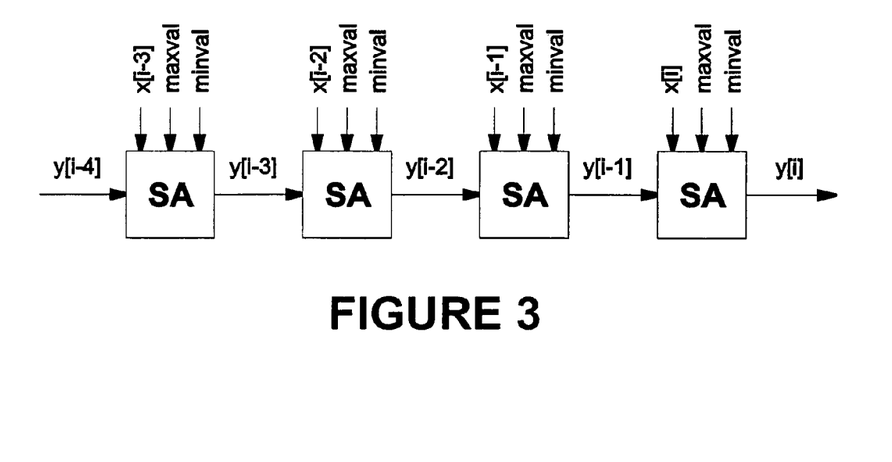
FIG. 3 shows a schematic of a chain of saturated additions.

Unrolling the computation needed to perform for saturated additions, a chain of saturated additions (SA) is obtained, such as that shown in FIG. 3. SA may be expressed as a function using max and min:

$$SA(y, x, \text{minval}, \text{maxval}) = \min(\max(y+x, \text{minval}), \text{maxval}) \qquad (5)$$

The saturated accumulation is repeated application of this function. This function should be expressed in such a way that repeated application is function composition. This allows the exploitation of the associativity of function composition so that saturated accumulation may be computed using a parallel-prefix tree.

Technically, function composition does not apply directly to the formula for SA shown in Equation 5 because that formula is a function of four inputs (having just one output, y). Fortunately, only the dependence on y is critical at each SA-application step; the other inputs are not critical, because it is easy to guarantee that they are available in time, regardless of our algorithm. To understand repeated application of the SA function, therefore, SA is expressed in an alternate form in which y is a function of a single input and the other "inputs" (x, minval, and maxval) are function parameters:

$$SA_{[x,m,M]}(y) \equiv SA(y, x, m, M) \quad (6)$$

SA[i] is defined as the $i^{th}$ application of this function, which has x=x[i], m=minval, and M=maxval:

$$SA[i] \equiv SA_{[x[i], minval, maxval]} \quad (7)$$

Figure 4:
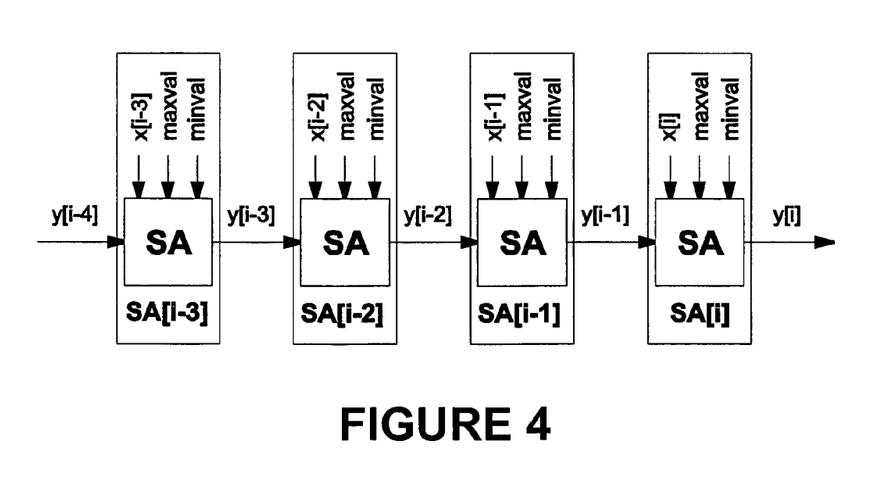
FIG. 4 shows a schematic of a function composition.

This definition allows viewing the computation as function composition, such as that shown schematically in FIG. 4. Thus:

$$y[i] = SA[i] \circ SA[i-1] \circ SA[i-2] \circ SA[i-3](y[i-4]) \quad (8)$$

Figure 5:
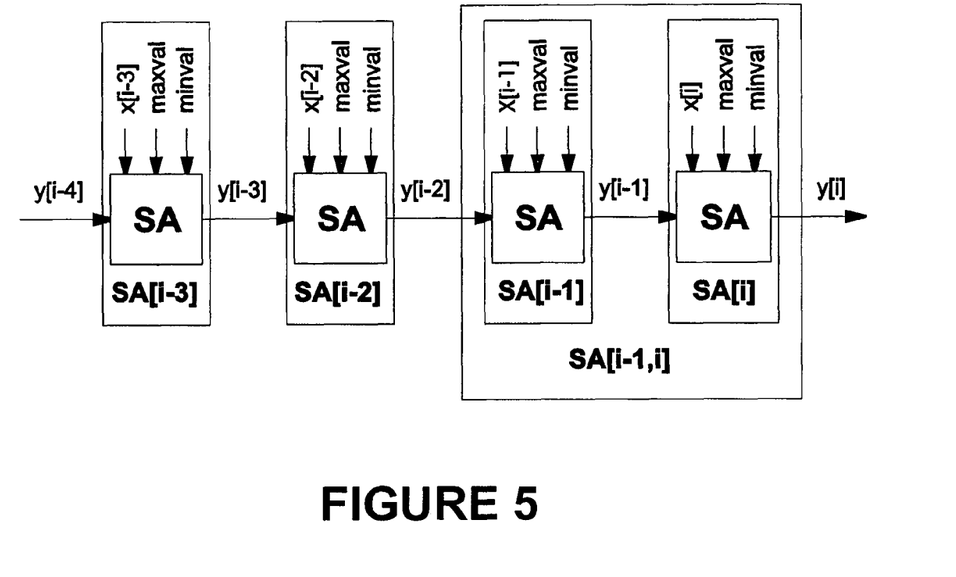
FIG. 5 shows a schematic of a function composition in which each adjacent pair of operations is computed in one step.

The chained input is the loop-carried input. The non-chained inputs are the inputs that are not generated by previous iterations of the loop. In FIGS. 3, 4, and 5, the y[i] inputs are the chained inputs, while the x[i] and maxval, minval inputs are the non-chained inputs.

FIG. 4, in contrast to FIG. 3, and Equation 6 show how specialized functions are created. Any function can be specialized by fixing one or more of its inputs to particular values. The number of inputs to the program resulting from specialization is the initial number of inputs minus the number of inputs whose values are constants. In the case above, a function of four inputs (y, x, maxval, minval) is transformed into a more specialized function of only one input (y). That function no longer takes x, maxval, and minval as inputs. Those values end up being folded by specialization into the function.

Composing the SA Functions

To reduce the critical latency implied by Equation 8, successive non-overlapping adjacent pairs of operations are first combined (just as was done with ordinary addition in Equation 4). For example:

$$y[i] = ((SA[i] \circ SA[i-1]) \circ (SA[i-2] \circ SA[i-3]))(y[i-4])$$

To make this practical, an efficient way is needed to compute each adjacent pair of operations in one step, as shown in the schematic of the function composition shown in FIG. 5:

$$SA[i-1, i] \equiv SA[i] \circ SA[i-1] \quad (9)$$

Figure 6:
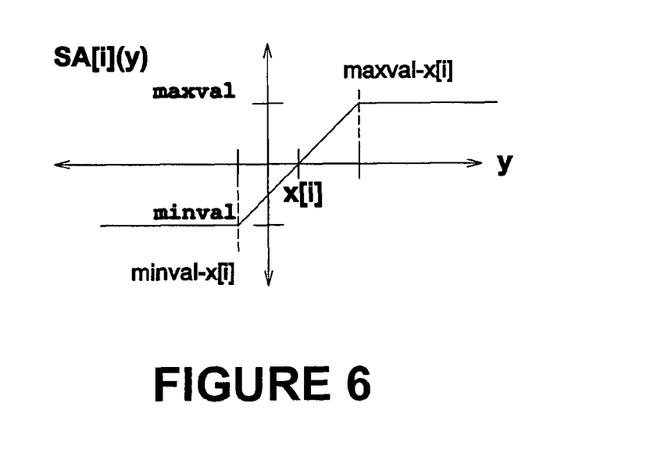
FIG. 6 shows a graph depicting the linearity of SA[i](y)

Viewed (temporarily) as a function of real numbers, SA[i] is a continuous, piecewise linear function, because it is a composition of "min", "max", and "+", each of which are continuous and piecewise linear (with respect to each of their inputs). It is a well known fact that any composition of continuous, piecewise linear functions is itself continuous and piecewise linear (this is demonstrated for the particular case below). The continuity and piecewise linearity of SA[i] may be easily visualized as shown in FIG. 6.

As the base functions SA[i−1] and SA[i] are continuous and piecewise linear, their composition (i.e. SA[i−1, i]) must also be continuous and piecewise linear. The key thing necessary to understand is how many segments SA[i−1, i] has? Since SA[i−1] and SA[i] each have just one bounded segment of slope one, their composition must also have just one bounded segment of slope 1 and have the form of Equation 6.

Figure 7:
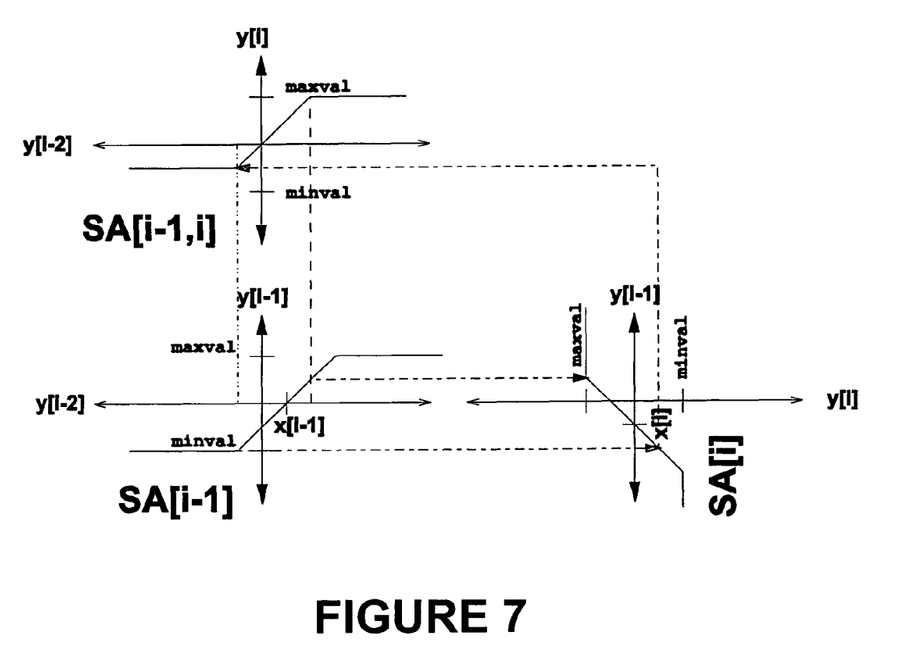
FIG. 7 shows a graph depicting the saturated add composition.

This fact can be visualized graphically as shown in FIG. 7. Any input below minval or above maxval into the second SA will be clipped to the constant minval or maxval. Input clipping on the first SA coupled with the add offset on the second can prevent the composition from producing outputs all the way to minval or maxval (See FIG. 7).

The extremes therefore will certainly remain flat just like the original SA. Between these extremes, both SAs produce linear shifts of the input. Their cascade is, therefore, also a linear shift of the input so results in a slope one region. Consequently, SA[i−1, i] has the same form as SA[i] (see Equation 6). As previously observed, the composition, SA[i−1, i], does not necessarily have m=minval and M=maxval. However, arbitrary values for the parameters m and M are allowed such that the form shown in Equation 6 is closed under composition. This allows regrouping the computation to reduce the number of levels in the computation.

Composition Formula

The form $SA_{[x, m, M]}$ therefore is closed under composition. However, to build hardware that composes these functions, an actual formula is needed for the [x, m, M] tuple describing the composition of any two SA functions $SA_{[x1, m1, M1]}$ and $SA_{[x2, m2, M2]}$.

Each SA is a sequence of three steps: TRanslation by x, followed by Clipping at the Bottom m, followed by Clipping at the Top M. These three primitive steps are re-written as $tr_x$, $cb_m$, and $ct_M$, respectively:

$$tr_x(y) \equiv y+x$$

$$cb_m(y) \equiv max(y,m)$$

$$ct_M(y) \equiv min(y,M)$$

$$SA_{[x, m, M]} = ct_M \circ cb_m \circ tr_x \quad (10)$$

Figure 8:
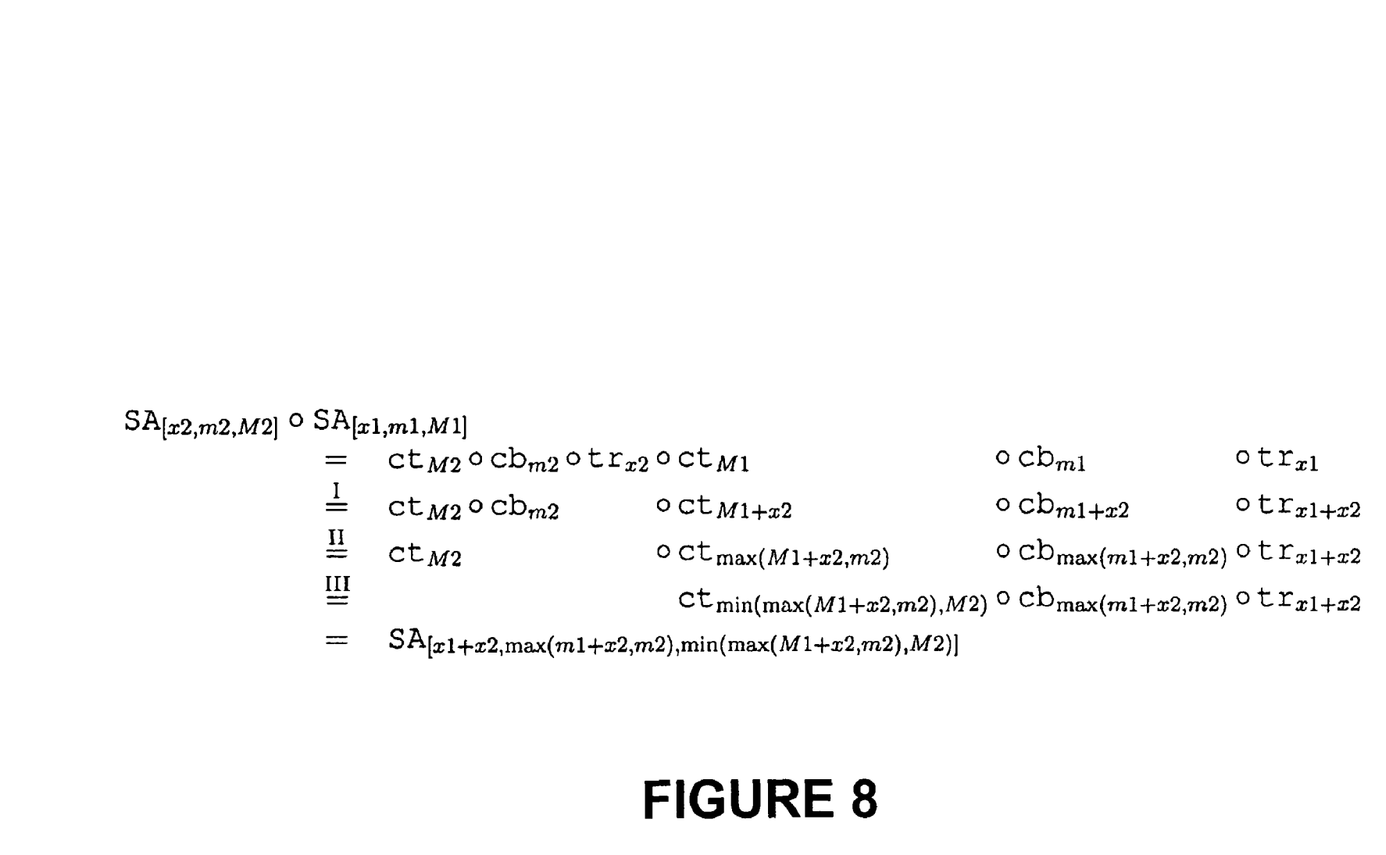
FIG. 8 shows the operator composition for chained saturated additions.

As shown in FIG. 8, a composition of two SAs written in the form of Equation 10 leads to a new SA written in the same form. The calculation is the following sequence of commutation and merging of the "tr"s, "cb"s, and "ct"s:

I. Commutation of Translation and Clipping

Clipping at M1 (or m1) and then translating by x2 is the same as first translating by x2 and then clipping at M1+x2 (or m1+x2).

II. Commutation of Upper and Lower Clipping $$g(y) = (cb_{m2} \circ ct_{M1+x2})(y) = (ct_{max(M1+x2, m2)} \circ cb_{m2})(y)$$

This is seen by case analysis: first suppose m2≦M1+x2. Then both sides of the equation are the piecewise linear function $$g(y) = \begin{cases} M1 + x2, & y \geq M1 + x2 \\ m2, & y \leq m2 \\ y, & \text{otherwise.} \end{cases} \quad (11)$$

On the other hand, if m2>M1+x2, then both sides are the constant function m2.

III. Merging of Successive Upper Clipping.

This is associativity of min:

$$ct_{M2} \circ ct_{M1} = ct_{min(M1,M2)}$$

Alternately, this can also be computed directly from the composed function.

Applying the Composition Formula

At the first level of the computation, m=minval and M=maxval. However, after each-adjacent pair of saturating additions (SA[i−1], SA[i]) has been replaced by a single saturating addition (SA[i−1,i]), the remaining computation no longer has constant m and M. In general, therefore, a saturating accumulation specification includes a different minval and maxval for each input. These values are denoted by minval[i] and maxval[i].

The SA to be performed on input number i is then:

$$SA[i](y) = \min(\max((y + x[i]), minval[i]), maxval[i]) \quad (12)$$

Composing two such functions and inlining, the following is obtained:

$$SA[i-1, i](y) = SA[i](SA[i-1](y)) \quad (13)$$

$$= \min(\max((\min(\max((y + x[i-1]),$$
$$minval[i-1]),$$
$$-maxval[i-1])$$
$$+x[i]),$$
$$minval[i]),$$
$$maxval[i])$$

This can be transformed (see Annex for the detailed steps of this transformation) into:

$$SA[i-1, i](y) = \min(\max((y + x[i-1] + x[i]), \quad (14)$$
$$\max((minval[i-1] + x[i]),$$
$$minval[i])),$$
$$\min(\max((maxval[i-1] + x[i]),$$
$$minval[i]),$$
$$maxval[i]))$$

This is the same thing as FIG. 8, as long as M2=maxval[i], m2=minval[i], M1=maxval[i−1], and m2=minval[i−1].

Now Compose is defined as the six-input, three-output function which computes a description of SA[i−1, i] given descriptions of SA[i−1] and SA[i]:

$$x' = x[i-1] + x[i] \quad (15)$$

$$minval' = \max((minval[i-1] + x[i]), \quad (16)$$
$$minval[i])$$

$$maxval' = \min(\max((maxval[i-1] + x[i]), \quad (17)$$
$$minval[i]),$$
$$maxval[i])$$

This gives:

$$SA[i-1, i](y) = \min(\max(y + x'), minval'), maxval') \quad (18)$$

Figure 10:
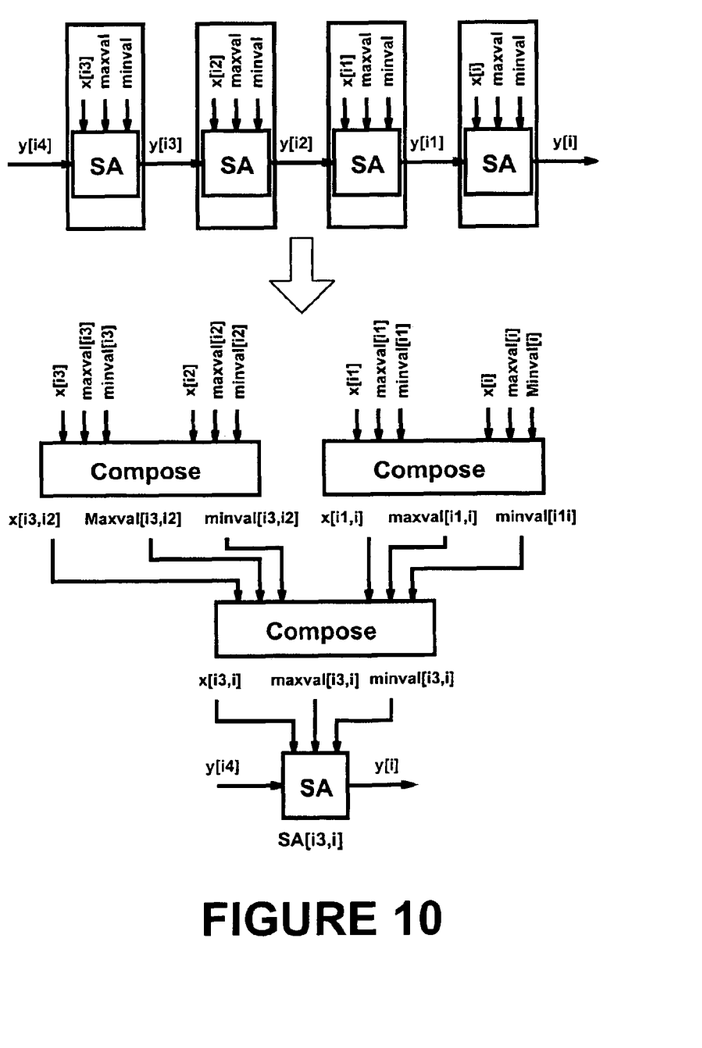
FIG. 10 shows a schematic of the composition of SA[(i−3), i]

SA[i, j](y) may be computed as shown in FIG. 10, which shows the composition of SA[(i−3), i]. This is a very similar strategy to the combination of "propagates" and "generates" in carry-lookahead addition.

Wordsize of Intermediate Values

The preceding correctness arguments rely on the assumption that intermediate values (i.e. all values ever computed by the Compose function) are mathematical integers; i.e., they never overflow. For a computation of depth k, at most 2k numbers are ever added, so intermediate values can be represented in W+k bits if the inputs are represented in W bits. While this gives an asymptotically tight result, all computation can be actually done with W+2 bits (2's complement representation) regardless of k.

First, maxval' is always between minval[i] and maxval[i]. The same is not true about minval', until a slight modification to Equation 16 is made; minval' is redefined as follows:

$$minval' = \min(\max((minval[i-1] + x[i]), \quad (19)$$
$$minval[i]),$$
$$maxval[i])$$

This change does not affect the result because it only causes a decrease in minval' when it is greater than maxval'. While doing the extra operation causes more work, only a constant increase of work is caused, and this extra work is done anyway if the hardware for maxval' is reused for minval'. (See below.) With this change, the interval [minval', maxval'] is contained in the interval [minval[i], maxval[i]], so none of these quantities ever requires more than W bits to represent.

If we use (W+2)-bit datapaths for computing x', x' can overflow in the tree, because the "x"s are never clipped. This arguably does not matter. Whenever x' overflows, it can be shown that its value is ignored, because a constant function is represented (i.e., minval'=maxval'). Furthermore, it is not necessary to keep track of when an overflow has occurred, since if minval=maxval, then minval'=maxval' at all subsequent levels of the computation, as this property is maintained by Equations 17 and 19.

Putting Together the Composer

Figure 9:
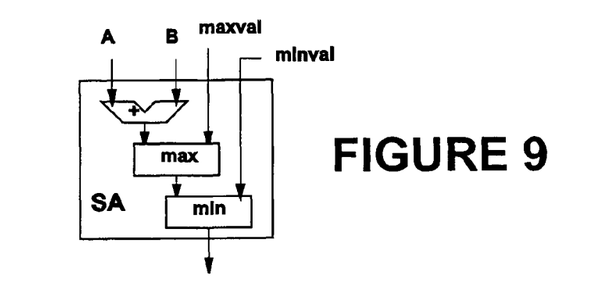
FIG. 9 shows a schematic of a saturated adder.

Knowing how to compute SA[i, i−1] from the parameters for SA[i] and SA[i−1], the computation can be unrolled to match the delay through the saturated addition and create a suitable parallel-prefix computation. From the foregoing, the core computation for the composer is known to be, itself, saturated addition (Equations 15, 17, and 19). Using the saturated adder shown in FIG. 9, the composer may be built as shown in FIG. 10.

Example of Implementation

The parallel-prefix saturated accumulator was implemented in Very-High-Speed Integrated Circuit Hardware Description Language (VHDL) to demonstrate functionality and get performance and area estimates. Modelsim 5.8, from Mentor Graphics, was used to verify the functionality of the design. Synplify Pro 7.7 from Synplicity, Inc. and the ISE 6.1.02i software tool suite from Xilinx were used to map the design onto the target device. No area constraints were provided. The tools automatically placed and routed the design using just the timing constraints.

A Spartan-3 (part XC3S-5000-4) FPGA, from Xilinx, was chosen as the target device. The Digital Clock Managers (DCMs) on the Spartan-3 (speed grade-4 part) support a maximum frequency of 280 Mhz (3.57 ns cycle), so this maximum supported frequency was picked as the performance target.

A logic family is a technology generation and gate library in a particular foundry. For FPGAs there are limits to the clock rates a particular device logic family will support. In this case Spartan 3 is the logic family; the same vendor, Xilinx, offers other families like the Virtex 2 family, the Virtex 4 family, and the XC4000 series.

Design Details

Figure 11:
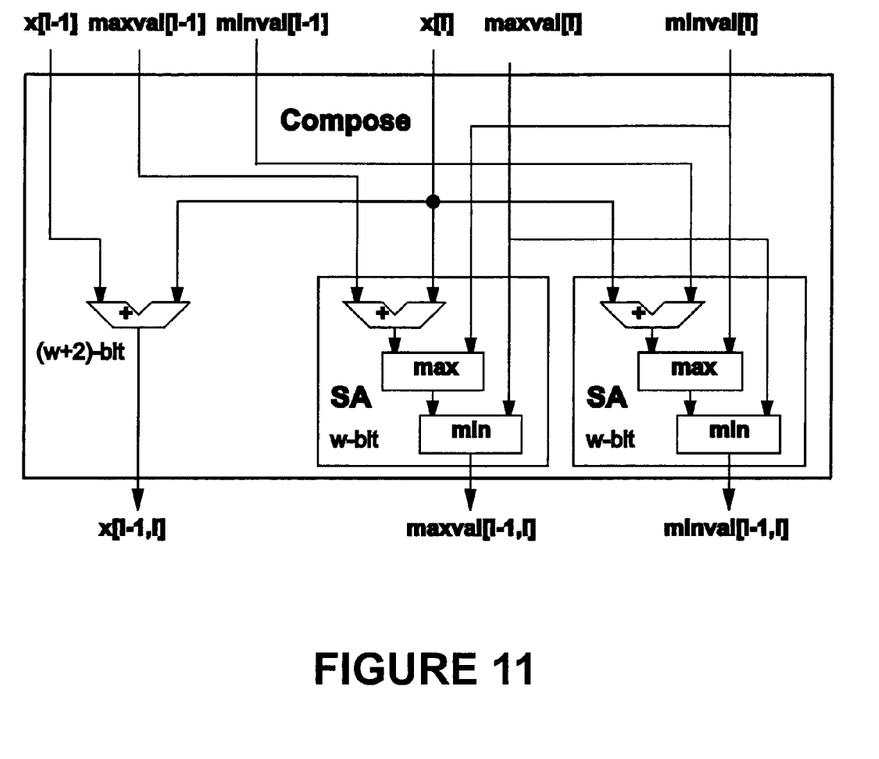
FIG. 11 shows a schematic of a composition unit for two saturated adders.
Figure 12:
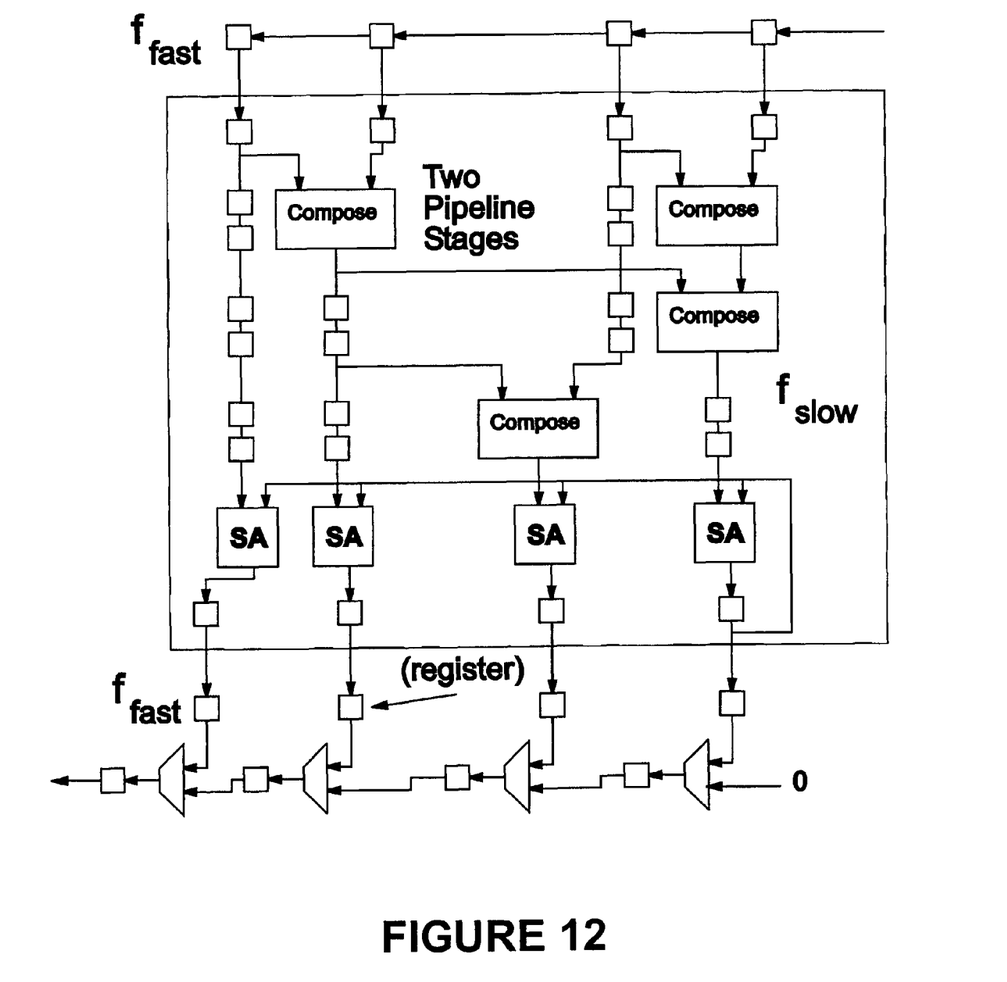
FIG. 12 shows a schematic of a composition unit for two saturated adders.

The parallel-prefix saturating accumulator consists of a parallel-prefix computation tree sandwiched between a serializer and deserializer as shown in FIG. 12. Consequently, the design is decomposed into two clock domains. The higher frequency clock domain pushes data into the slower frequency domain of the parallel-prefix tree. The parallel-prefix tree runs at a proportionally slower rate to accommodate the saturating adders shown in FIGS. 9 and 11. Minimizing the delays in the tree requires computation of each compose in two pipeline stages. Finally, the result of the prefix computation is clocked into the higher frequency clock domain in parallel and then the data is serially shifted out at the higher clock frequency.

It is worthwhile to note that the delay through the composers is actually irrelevant to the correct operation of the saturated accumulation. The composition tree adds a uniform number of clock cycle delays between the x[i] shift register and the final saturated accumulator. It does not add to the saturated accumulation feedback latency which the unrolling must cover. This is why compose stages can be safely pipelined in the parallel-prefix tree.

Area

The area required by this design is expressed as a function of N (loop unroll factor) and W (bitwidth). Intuitively, the area required for the prefix tree will be seen to be roughly $5\frac{2}{3}$ N times the area of a single saturated adder. The initial reduce tree has roughly N compose units, as does the final prefix tree. Each compose unit has two W-bit saturated adders and one (W+2)-bit regular adder, and each adder requires roughly W/2 slices. Together, this gives us $\approx 2 \times (2 \times 3+1)$ NW/2 slices. Finally, a row of saturated adders is added to compute the final output to get a total of (17/2)(NW) slices. Compared to the base saturated adder which takes (3/2)W slices, this is a factor of $(17/3)N=5\frac{2}{3}$ N.

Pipelining levels in the parallel-prefix tree roughly costs $2\times 3 \times N$ registers per level times the $2 \log_2(N)$ levels for a total of $12N \log_2(N)W$ registers. The pair of registers for a pipe stage can fit in a single 16-bit shift register look-up table (SRL16), so this should add no more than $3N \log_2(N)W$ slices.

$$A(N,W) \approx 3N \log_2(N)W+(17/2)NW \qquad (20)$$

This approximation does not count the overhead of the control logic in the serializer and deserializer since it is small compared to the registers. For ripple carry adders, N=O(W) and thus area will scale as $O(W^2 \log(W))$. If efficient, log-depth adders are used, $N=O(\log(W))$ and area scales as $O(W \log(W) \log(\log(W)))$.

If the size of the tree is N and the frequency of the basic unpipelined saturating accumulator is f, then the system can run at a frequency f×N. By increasing the size of the parallel-prefix tree, the design can be made to run arbitrarily fast, up to the maximum attainable speed of the device. Table 2 in the Annex shows the value of N (i.e., the size of the prefix tree) required to achieve a 3 ns cycle target. This tighter cycle time (compared to the 3.57 ns DCM limit) is targeted to reserve some headroom going into place and route for the larger designs.

Results

Table 3 in the Annex shows the clock period achieved by all the designs for N=4 after place and route. The required 3.57 ns performance limit is bettered for all the cases considered. Table 3 in the Annex shows the actual area in SLICEs required to perform the mapping for different bitwidths W. A 16-bit saturating accumulator requires 1065 SLICEs which constitutes around 2% of the Spartan-3 XC3S-5000 FPGA. An area overhead of less than 25× is required to achieve this speedup over an unpipelined simple saturating accumulator; for N=4, $5\frac{2}{3}N \approx 23$, so this is consistent with the intuitive prediction above.

Saturated accumulation has a loop dependency that, naively, limits single-stream throughput and a designer's ability to fully exploit the computational capacity of modern FPGAs. This loop dependence is actually avoidable by reformulating the saturated addition as the composition of a series of functions. This particular function composition is, asymptotically, no more complex than the original saturated addition operation. Function composition is associative, so this reformulation allows building a parallel-prefix tree in order to compute the saturated accumulation over several loop iterations in parallel. Consequently, the saturated accumulation loop can be unrolled to cover the delay through the saturated adder. As a result, saturated accumulation can be computed at any data rate supported by an FPGA or custom integrated circuit. Note that even in full custom circuits, there is a limit to reasonable clock rates around 8 FO4 (fanout-4) inverter delays. The speed at which saturated accumulation can be run using these techniques is as fast as anything one can run on the raw hardware. It is not limited by the fact there is a long path in the saturated adder or affected by the width of the addition that one may want to perform.

Pipelining a Loop with One or More Loop-Carried Dependencies

A loop carried-dependency results when an iteration of a loop computes a value that is required by a subsequent iteration of the loop, i.e., there is a dependency between one loop body and a later body of the same loop.

Technically, any loop of the form:

Y[0]=INITIAL_VALUE for (i=1; i<BOUND; i++)

Y[i]=f(Y[i−1], X[i])

is a loop with a loop-carried dependency, where f is a function in the mathematical sense that it has no state and always maps from the same input values to the same output value. A BOUND is not actually needed because the computation can continue indefinitely. Also, there can be more than one non-dependent input, and the loop-carried value could be more than one value. If Y[i] and X[i] are thought of as being structures or arrays of some finite length:

X[i], Y[i] are arrays of finite length structures.

Y[0]=INITIAL_VALUE for (i=1; i<BOUND, i++)

Y[i]=f(Y[i−1],X[i])

For the transformation of the form described in this disclosure to be profitable, it must be possible to compute the composition of f's efficiently. A method for doing so has been shown above for the saturated addition case.

In all cases, it is necessary to be able to compute the function:

f'(Y[i−2])=f(f(Y[i−2], X[i−1]),X[i])

The function composition must be computed rather than intermediate values. This disclosure has shown how to compute values to represent the effect of the function composition for the saturated addition case and the method can be generalized to other cases to permit pipelining.

For another specific example, consider:

X[i]=structure with two fields

Boolean s0;

Boolean s1;

f(y, X[i])=s0 if y=0 s1 if y=1

Y[0]=INITIAL_VALUE for (i=1; i<BOUND, i++)

Y[i]=f(Y[i−1], X[i])

f'(Y[i−2])=f(f(Y[i−2], X[i−1]), X[i])

The composition of two f's can be computed as another function of f by composing the X's appropriately.

$$Y[i]=f(Y[i-2])=f(Y[i-2], X'[i-1, i])$$

The composition of the X's is computed as follows:

$X'[i-1, i] \cdot s0=0$ if $(X[i] \cdot s0=0$ & $X[i] \cdot s1=0)$ 1 if $(X[i] \cdot s0=1$ & $X[i] \cdot s1=1)$ $X[i-1] \cdot s0$ if $(X[i] \cdot s0=0$ & $X[i] \cdot s1=1)$ $X[i-1] \cdot s0$ if $(X[i] \cdot s0=1$ & $X[i] \cdot s1=0)$ $X'[i-1, i] \cdot s1=0$ if $(X[i] \cdot s0=0$ & $X[i] \cdot s1=0)$ 1 if $(X[i] \cdot s0=1$ & $X[i] \cdot s1=1)$ $X[i-1] \cdot s1$ if $(X[i] \cdot s0=0$ & $X[i] \cdot s1=1)$ $X[i-1] \cdot s1$ if $(X[i] \cdot s0=1$ & $X[i] \cdot s1=0)$ While several illustrative embodiments of the invention have been shown and described in the above description, numerous variations and alternative embodiments will occur to those skilled in the art. Such variations and alternative embodiments are contemplated, and can be made, without departing from the scope of the invention as defined in the appended claims.

What is claimed is:

1. A parallel-prefix saturated accumulator, comprising:
    a deserializer adapted to convert a plurality of serial inputs to a plurality of parallel inputs;
    a parallel-prefix processor adapted to convert the plurality of parallel inputs into a plurality of parallel-prefix processed signals;
    a serializer adapted to combine the plurality of parallel-prefix processed signals to an output; and
    at least one register adapted to pipeline calculations of the parallel-prefix saturated accumulator,
    wherein the parallel-prefix processor comprises:
        at least one composer comprising one or more adders and one or more saturated accumulators;
        at least one saturated accumulator connected with the at least one composer; and
        at least one register connected with the at least one composer and with the at least one register.

2. The parallel-prefix saturated accumulator according to claim 1, wherein the at least one saturated accumulator comprises an adder, a first comparator connected with the adder, and a second comparator connected with the first comparator.

3. The parallel-prefix saturated accumulator according to claim 1, wherein the at least one saturated accumulator comprises four inputs (A, B, maxval, and minval) and one output y, said output y being a saturated accumulative sum defined by $$y=\min(\max((A+B), \text{minval}), \text{maxval}).$$

4. The parallel-prefix saturated accumulator according to claim 1, wherein the at least one composer comprises an adder, and two saturated accumulators.

5. The parallel-prefix saturated accumulator according to claim 4, wherein the data width of the adder is two bits wider than that of each of the two saturated accumulators.

6. The parallel-prefix saturated accumulator according to claim 1, wherein the at least one composer has six inputs x[i−1], maxval[i−1], minval[i−1], x[i], maxval[i], minval[i]) and three outputs (x[i−1, i], maxval[i−1, i], min[i−1, i]) defined by the following functions:

$x[i-1, i]=x[i-1]+x[i];$ $\text{maxval}[i-1, i]=\min(\max((x[i]+\text{maxval}[i-1]), \text{minval}[i]), \text{maxval}[i]);$ and $\text{minval}[i-1, i]=\min(\max((x[i]+\text{minval}[i-1]), \text{minval}[i]), \text{maxval}[i]).$ 7. A method for calculating a saturated accumulative sum in a parallel-prefix manner, comprising:
    converting a plurality of serial inputs into a plurality of parallel inputs with a deserializer;
    obtaining a plurality of parallel-prefix processed signals by processing the plurality of parallel inputs with a parallel-prefix processor;
    obtaining a saturated accumulative sum of the plurality of serial inputs by combining the plurality of parallel-prefix processed signals with a serializer,
    wherein the parallel-prefix processor comprises:
        at least one composer;
        at least one saturated accumulator connected with the at least one composer comprising one or more adders and one or more saturated accumulators; and
        at least one register connected with the at least one composer and with the at least one register.

8. The method according to claim 7, wherein the at least one saturated accumulator comprises an adder, a first comparator connected with the adder, and a second comparator connected with the first comparator.

9. The method according to claim 7, wherein the at least one saturated accumulator comprises four inputs (A, B, maxval, and minval) and one output y, said output y being a saturated accumulative sum defined by $$y=\min(\max((A+B), \text{minval}), \text{maxval}).$$

10. The method according to claim 7, wherein the at least one composer comprises an adder, and two saturated accumulators.

11. The method according to claim 10, wherein the data width of the adder is two bits wider than that of each of the two saturated accumulators.

12. The method according to claim 7, wherein the at least one composer has six inputs (x[i−1], maxval[i−1], minval[i−1], x[i], maxval[i], minval[i]) and three outputs (x[i−1, i], maxval[i−1, i], min[i−1, i]) defined by the following functions:

$x[i-1, i]=x[i-1]+x[i];$ $\text{maxval}[i-1, i]=\min(\max((x[i]+\text{maxval}[i-1]), \text{minval}[i]), \text{maxval}[i]);$ and $\text{minval}[i-1, i]=\min(\max((x[i]+\text{minval}[i-1]), \text{minval}[i]), \text{maxval}[i]).$

* * * * *

UNITED STATES PATENT AND TRADEMARK OFFICE
CERTIFICATE OF CORRECTION

PATENT NO.            : 7,853,637 B2
APPLICATION NO.       : 11/331830
DATED                 : December 14, 2010
INVENTOR(S)           : Karl Papadantonakis, Stephanie Chan and Andre M. DeHon It is certified that error appears in the above-identified patent and that said Letters Patent is hereby corrected as shown below:

In Column 1, lines 19-22, the wording should appear as follows:

The present invention was made with support from the United States Government under Grant No. CCR-0205471 awarded by the National Science Foundation (NSF). The United States Government has certain rights in the invention.

Signed and Sealed this
Twenty-second Day of February, 2011

David J. Kappos
*Director of the United States Patent and Trademark Office*